United States Patent
Khellah et al.

(10) Patent No.: US 7,307,899 B2
(45) Date of Patent: Dec. 11, 2007

(54) REDUCING POWER CONSUMPTION IN INTEGRATED CIRCUITS

(75) Inventors: Muhammad M. Khellah, Tigard, OR (US); Dinesh Somasekhar, Portland, OR (US); Yibin Ye, Portland, OR (US); Vivek K. De, Beaverton, OR (US); James W. Tschanz, Portland, OR (US); Stephen H. Tang, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 11/134,450

(22) Filed: May 23, 2005

(65) Prior Publication Data

US 2006/0262610 A1 Nov. 23, 2006

(51) Int. Cl.
*G11C 7/00* (2006.01)
*G11C 11/00* (2006.01)
*G11C 7/10* (2006.01)
*G11C 8/00* (2006.01)

(52) U.S. Cl. ............ 365/189.11; 365/154; 365/189.01; 365/230.03; 365/236

(58) Field of Classification Search ............... 365/154, 365/189.11, 230.03, 189.01
See application file for complete search history.

(56) References Cited

U.S. PATENT DOCUMENTS

| | | |
|---|---|---|
| 6,515,513 B2 | 2/2003 | Ye et al. |
| 2001/0013806 A1* | 8/2001 | Notani ................ 327/534 |
| 2003/0160634 A1* | 8/2003 | Mushiga et al. .......... 326/81 |
| 2003/0184364 A1* | 10/2003 | Miyagi ................ 327/544 |
| 2004/0080340 A1* | 4/2004 | Hidaka ................ 326/83 |
| 2006/0232321 A1* | 10/2006 | Chuang et al. ......... 327/427 |

* cited by examiner

*Primary Examiner*—Ly Duy Pham
(74) *Attorney, Agent, or Firm*—Venable LLP; James R. Burdett; Jeffri A. Kaminski

(57) ABSTRACT

A method and apparatus for reducing power consumption in integrated memory devices is provided. Banks of memory cells may be individually put into "sleep" mode via respective "sleep" transistors.

5 Claims, 7 Drawing Sheets

REDUCING POWER CONSUMPTION IN INTEGRATED CIRCUITS

BACKGROUND OF THE INVENTION

In contemporary microprocessors, the size of on-die Static Random Access Memory (SRAM) cache almost doubles every generation. This is largely enabled by technology feature scaling which allows more device integration from one process to the next. As feature length scales, both gate oxide thickness and threshold voltage scale too. This considerably increases gate-oxide and sub-threshold leakage currents, respectively. Larger leakage power is a major concern for mobile and reliable operation. In general, a hefty portion of a microprocessor's total active leakage power is consumed by SRAM cache. This is because on chip SRAM (with millions of cells) is at any given cycle in a "stand-by" state. This means that the SRAM is basically doing nothing except preserving stored data. Upon access, only one row in a given memory bank is activated (either being read or written).

With the partitioning of the SRAM into a larger number of small memory banks, aggressive power management techniques can be employed by collapsing the power supply of unselected memory banks. These techniques leverage the higher intrinsic stability of the SRAM cell when it is unselected. The intrinsic stability of the SRAM cell corresponds to the noise-margin of the cross-coupled inverter loop of the cell when it is disconnected from the bit-lines. In contrast, the read stability of the SRAM cell corresponds to the noise-margin of the inverter loop with the word-line being active and the cell internal nodes being connected to the bit-lines. The read instability is usually worse than the intrinsic stability. Consequently the power supply can be dropped to a far lower value than is the case with the cell being read-out. Powering down the supply may be accomplished by the use of "sleep switches" which are deactivated when cells are idled and activated when the cells are being written or read out.

Standby leakage current is the current which may flow through a logic circuit when a transistor within the circuit is at high impedance and attempting to hold an output voltage at a certain level. Standby leakage current can cause a loss of the signal output and can also increase power consumption of the logic circuit. There is therefore a need to reduce standby leakage current and power consumption of logic circuits.

BRIEF DESCRIPTION OF THE DRAWINGS

The invention may be understood by referring to the following description and accompanying drawings, wherein like reference numbers generally indicate identical, functionally similar, and/or structurally similar elements.

DETAILED DESCRIPTION OF EXEMPLARY EMBODIMENTS OF THE PRESENT INVENTION

Embodiments of the present invention may include apparatuses for performing the operations herein. An apparatus may be specially constructed for the desired purposes, or it may comprise a general purpose device selectively activated or reconfigured by a program stored in the device.

Embodiments of the invention may be implemented in one or a combination of hardware, firmware, and software. Embodiments of the invention may also be implemented as instructions stored on a machine-accessible medium, which may be read and executed by a computing platform to perform the operations described herein. A machine-accessible medium may include any mechanism for storing or transmitting information in a form readable by a machine (e.g., a computer). For example, a machine-accessible medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Figure 1:
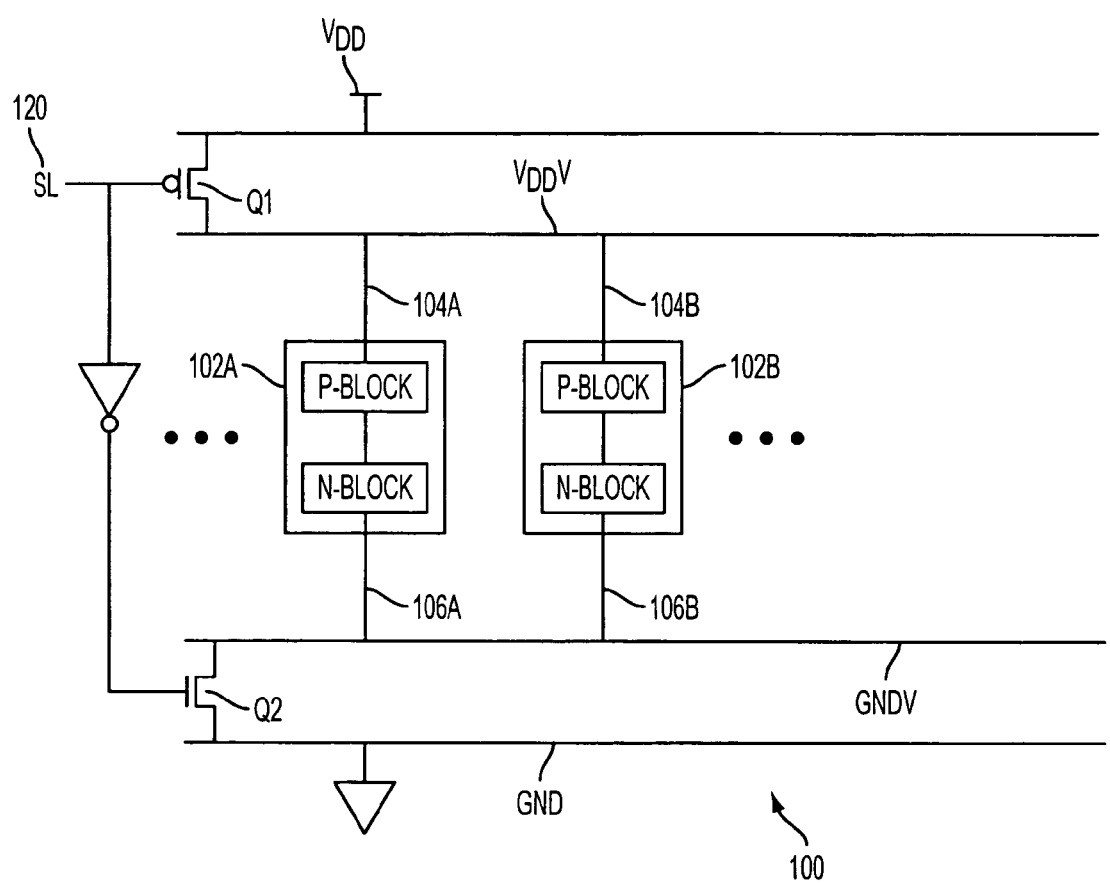
FIG. 1 is a schematic diagram of a prior art memory architecture.

One approach to reducing standby leakage current in CMOS circuits is described with reference to FIG. 1. A CMOS logic circuit 100 includes a series of CMOS logic gates 102A-102B. Logic circuit 100 includes "sleep" transistors Q1 and Q2, which are connected between the supply voltage, $V_{DD}$, and common ground, GND, respectively, to establish "virtual" supply lines, VDDV and GNDV. The source terminals 104A-104B of the P-block transistors of each CMOS logic gate 102A-102B may be connected to VDDV, while the source terminals 106A-106B of the N-block transistors may be connected to GNDV. By P-block (or N-block) it is meant a circuit that includes one or more p-channel (or n-channel) transistors.

In operation, in "sleep mode", SL 120 may be at logic-level "1", which turns off the sleep transistors Q1 and Q2 and cuts off the leakage current that may otherwise pass through the logic gates 102A-102B. In "active mode", SL 120 may be at logic-level "0", turning on Q1 and Q2, allowing the logic gates 102A-102B to evaluate. When in "active mode", the sleep transistors may produce a VDDV, which is lower than $V_{DD}$ due to a voltage drop through Q1, and may produce a GNDV which is higher than common ground due to a voltage drop through Q2. As a result, the effective voltage seen by the logic circuits 102A-102B may be less than the difference between $V_{DD}$ and common ground.

Figures 1, 2A:
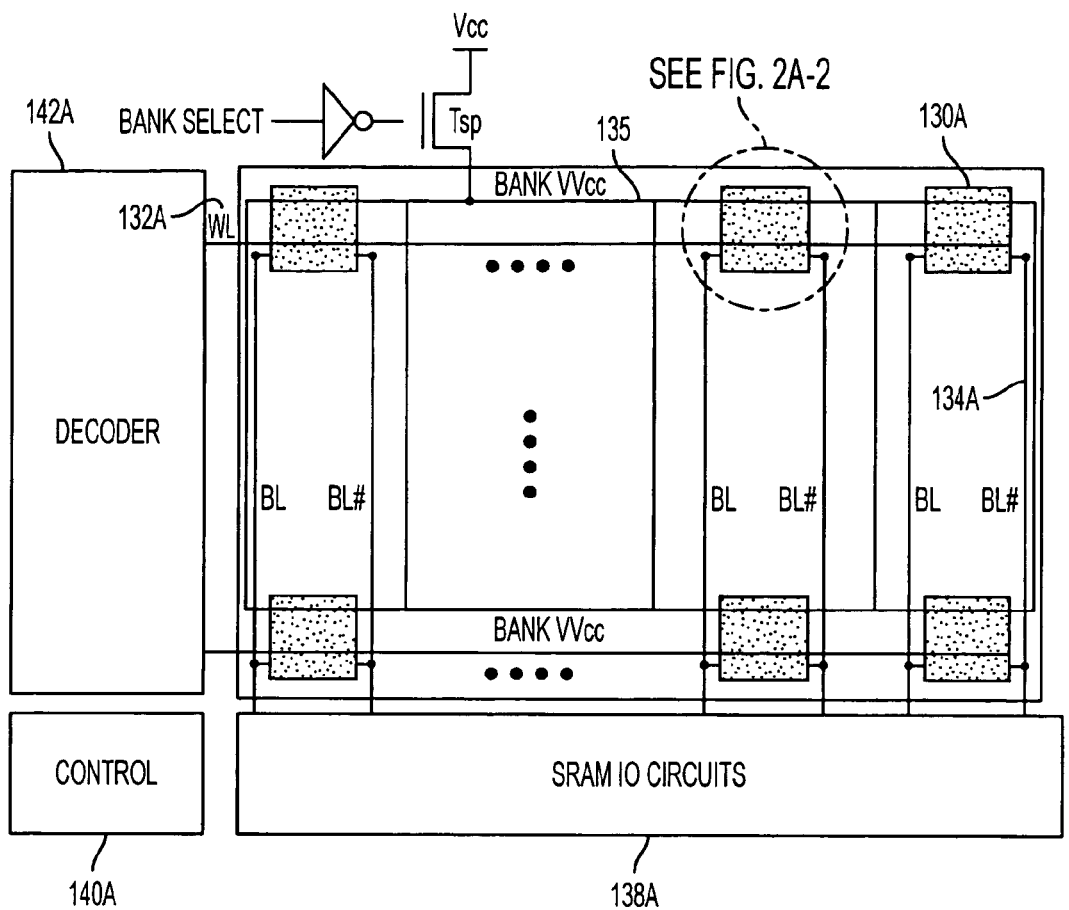
FIGS. 2A and 2B are schematic illustrations of a SRAM bank with sleep devices.
Figures 2, 2A:
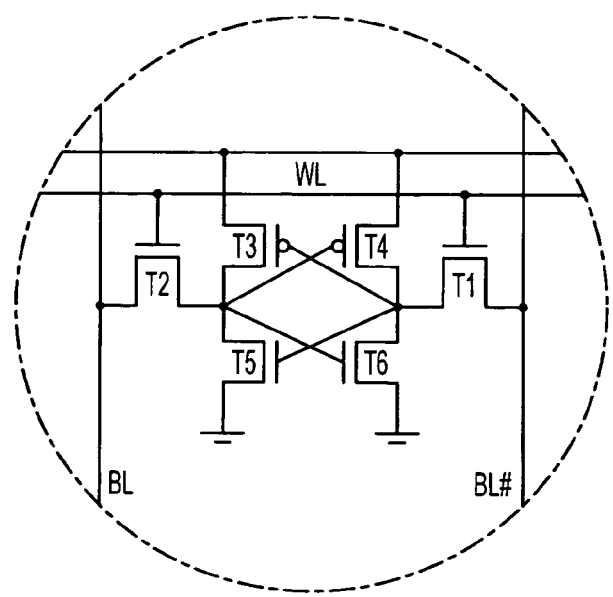
Figures 1, 2B:
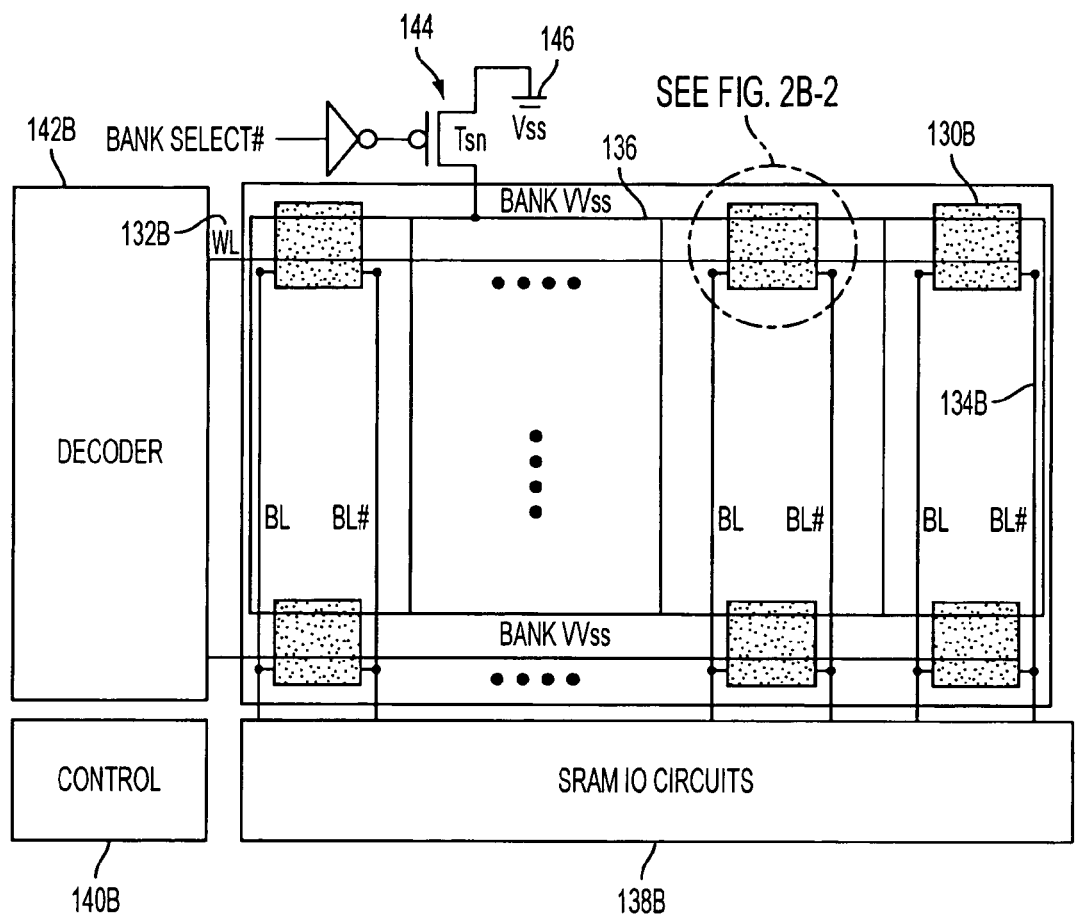
Figures 2, 2B:
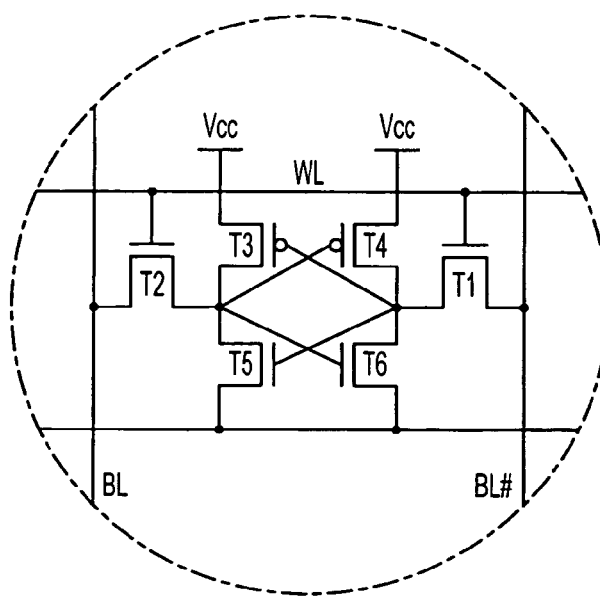

The logic circuits 102A, 102B may comprise SRAM arrays. FIGS. 2A and 2B illustrate an exemplary SRAM arrangement. A number of SRAM cells 130A, 130B may be arranged in an array. The cells 130A, 130B may be selected and accessed via word lines 132A, 132B and bit lines 134A, 134B in a known manner. SRAM I/O circuits 138A, 138B control circuits 140A, 140B, and decoders 142A, 142B may be used to select the appropriate word line 132A, 132B and bit line 134A, 134B for memory cell access. In FIG. 2A, a transistor $T_{sp}$ is coupled to $V_{cc}$ to form a virtual supply line 135 and in FIG. 2B a transistor $T_{sp}$ is coupled to $V_{ss}$ to form virtual supply line 136. FIGS. 2A and 2B illustrate two possible arrangements for sleep devices in an SRAM memory bank. A sleep device, for example a sleep transistor, may be placed either on the $V_{cc}$ grid as shown in FIG. 2A or on the $V_{ss}$ grid as shown in FIG. 2B of the SRAM memory bank. In general, the sleep transistor may be turned off right after the memory bank is idled and may be enabled when the memory bank is activated. In the discussion below, it is assumed that the sleep transistor is placed on the $V_{ss}$ grid of the SRAM memory bank. The circuits described below may be designed in a complementary fashion to control a sleep transistor coupled to the $V_{cc}$ grid.

Figure 3A:
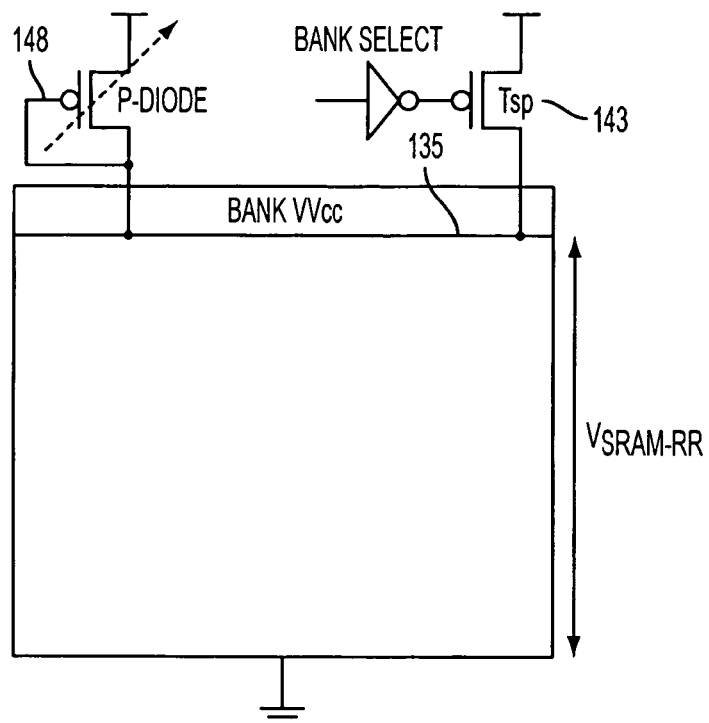
FIGS. 3A and 3B are schematic illustrations of a SRAM bank with sleep devices and clamping diodes.
Figure 3B:
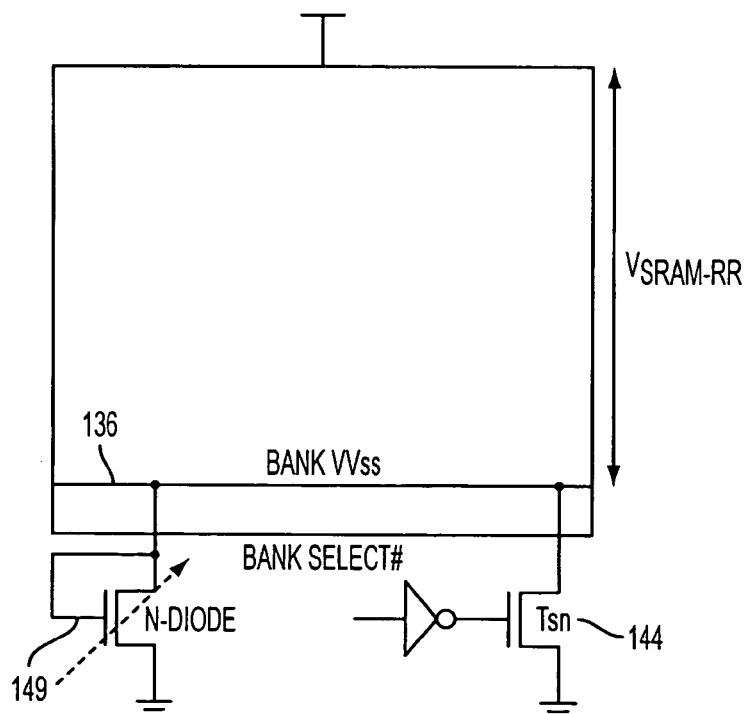

Referring now to FIG. 3B, the leakage current of the SRAM bank may flow through sleep transistor 144 and not directly to the ground node 146 when an SRAM array is idled. A single sleep transistor 144 may be provided for the entire memory bank. As a result, the voltage drop across sleep transistor 144 may force the virtual Vss grid 136 of the SRAM array to rise. The rail-to-rail voltage across the SRAM bank ($V_{SRAM-RR}$) drops and the leakage current through the SRAM goes down. It is possible—without any additional circuits—that the voltage of the SRAM array could completely collapse resulting in a loss of data in the memory bank. To prevent this, a set clamping diodes may be used to prevent the rise of VVss 136 beyond the intrinsic stability voltage of the SRAM $V_{CCMIN}$. In other words, $V_{SRAM-RR}$ should be greater than or equal to $V_{CCMIN}$. This may be achieved by tuning the clamping diodes to achieve the required drop.

FIGS. 3A and 3B illustrate an exemplary arrangement of clamping diodes. In FIG. 3A, the sleep transistor 143 may be coupled to the virtual supply line 135. A clamping diode 148 may also be coupled to the virtual supply line 135 and to the power supply line $V_{cc}$. In FIG. 3B, the sleep transistor 144 may be coupled to the virtual supply line 136 and the ground node 146. A clamping diode 149 may be coupled to the virtual supply line 136 and to the ground node 146. It is important to realize that the size of the sleep transistor 144 may be made very large in order to sink the active current when the memory bank is accessed. The dynamic power overhead of driving the sleep transistor on and off may reduce the efficiency of this scheme. If a memory bank is accessed ($\alpha$) percentage of the time (for example, $\alpha=0.05$ if a bank is accessed once every 20 cycles), $P_{DynOvh}$ is the dynamic overhead power, $P_{LEAKSLEEP}$ is the sleep leakage power, and $P_{LEAK}$ is the leakage power, then effective leakage power reduction is given by:

$$\text{Savings} = \frac{\alpha \cdot P_{DynOvh} + (1-\alpha) \cdot P_{LEAKSLEEP}}{P_{LEAK}} \quad \text{EQ 1}$$

It is clear from EQ1 that the smaller $\alpha$ is, the larger the savings. Note that $P_{LEAKSLEEP}$ depends on how long the memory bank is in sleep mode. It may take a few cycles for the VVss line to reach Vccmin. If the memory bank is quickly accessed long before this period of time elapses, $P_{LEAKSLEEP} \approx P_{LEAK}$ and so this scheme may not result in any savings. In fact, the dynamic power may increase rather than decrease. Fortunately, as the cache size increases and so does the number of memory banks, $\alpha$ per memory bank may go down as well. However, for some applications, the same memory bank, (or a few memory banks) may be accessed over and over. In this case, and in order to minimize overhead power, a method and apparatus to progressively turn off sleep devices may be used.

Figure 4:
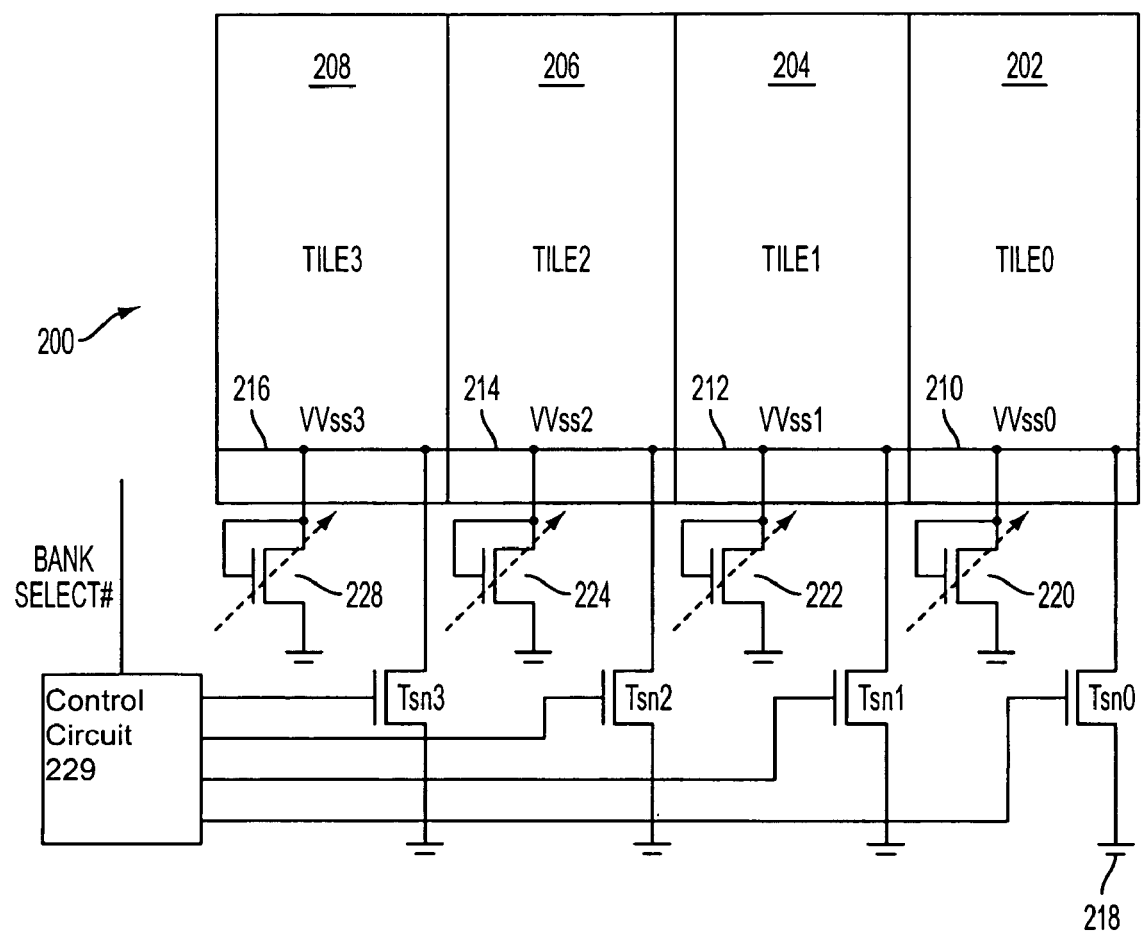
FIG. 4 is a schematic illustration of a circuit for progressive deactivation of sleep transistors according to an embodiment of the invention.

FIG. 4 illustrates an integrated circuit memory that has been divided into a number of smaller memory banks. The memory bank 200, in turn, may be divided into a number of smaller memory blocks such as tiles 202-208. The tiles 202-208 may be comprised of a number of memory cells. The size and layout of the tiles may depend on the specific circuit design and implementation. For example, memories typically include a number bit lines and word lines. A tile may be comprised of a group of memory cells including 128 bit lines, 64 bit lines, 16 bit lines, etc. A switch, such as a transistor, may be coupled to a supply line. The supply line may be either a power supply line such as Vcc or a common ground such as Vss. The switches may establish a virtual supply line. Each tile may be provided with its own respective switch Tsn(i) and virtual supply line 210-216. In the embodiment illustrated, the supply line 218 is ground and the virtual supply lines are virtual ground lines 210-216. However, the design can easily be implemented in a complementary fashion based on a power supply line. The switches Tsn(i) may be what are commonly referred to as sleep transistors and may have one electrode coupled to a respective one of the virtual supply lines 210-216 and another electrode coupled to the supply line 218. A control electrode for each sleep transistor $T_{sn(i)}$ may be coupled to a control circuit 228. The control circuit 228 may supply a control signal that may be used to turn the sleep transistors $T_{sn(i)}$ on and off. A clamping diode 220, 222, 224, 228 may have one electrode coupled to a respective virtual supply line 210-216 and another electrode coupled to ground.

In the scheme shown in FIG. 4, a memory bank is divided into N tiles with each tile having its own sleep device Tsn(i). When the memory bank 200 is accessed, all of the sleep transistors $T_{sn(i)}$ may be turned on. This allows data to be read into or read out of the memory bank 200. When the memory bank 200 is idle, the sleep transistors $T_{sn(i)}$ may be turned off. The sleep transistors $T_{sn(i)}$ may be selectively turned on and off to reduce the leakage power and dynamic power of the memory bank. The sleep transistors $T_{sn(i)}$ may be turned off in a progressive manner, individually or in groups. For example, the sleep transistors may be turned off one after another. A control circuit 229 may be provided to control the sleep transistors. The control circuit 229 may comprises any type of control circuit. In one exemplary embodiment, the control circuit 229 may comprise a timer such as a counter. The timer may be used to provide control signals to turn the sleep transistors $T_{sn(i)}$ on and off. One sleep transistor may be turned off every predetermined number of clock cycles. For example, sleep transistor Tsn(1) may be turned off after 5 clock cycles, sleep transistor Tsn(2) may be turned off after 10 clock cycles, sleep transistor Tsn(3) may be turned off after 15 clock cycles, etc. This is opposite the conventional scheme discussed above, where each sleep transistor is turned off right after the memory bank is deselected, resulting in a suddenly large dynamic power overhead. The sleep transistors may be turned off in any desired pattern.

Figure 5:
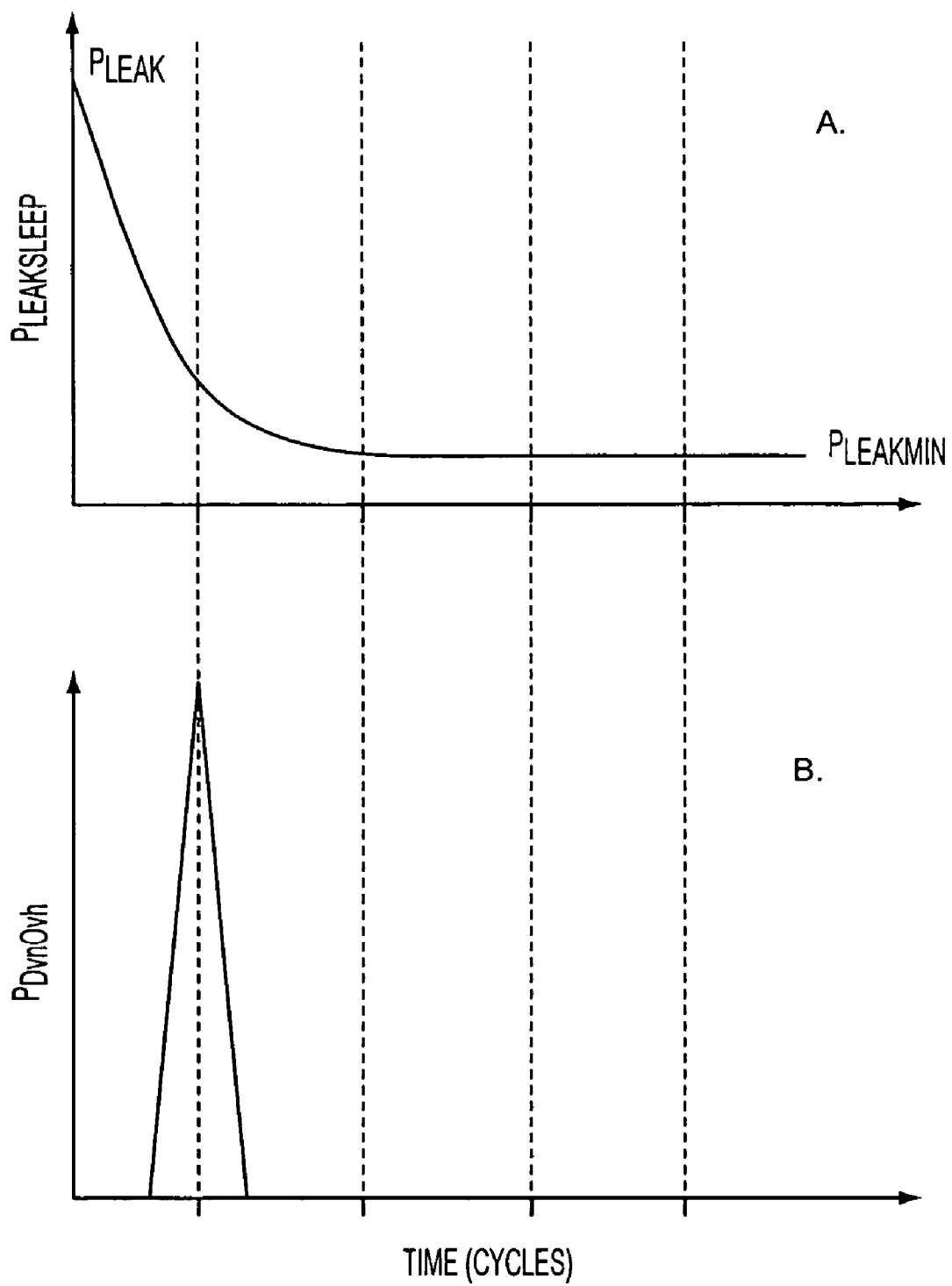
FIGS. 5A and 5B are graphs indicating leakage and dynamic power of prior art devices.
Figure 6:
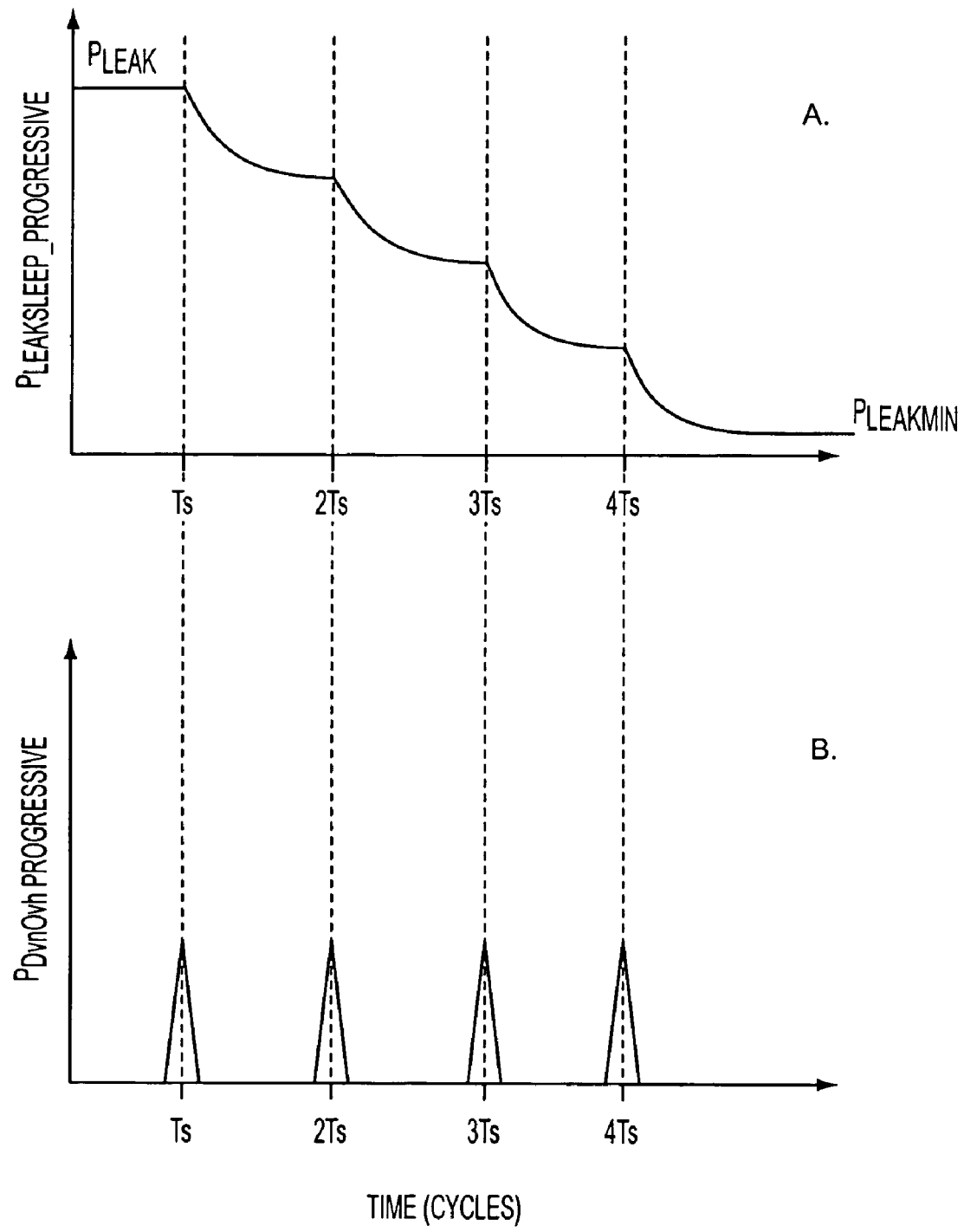
FIGS. 6A and 6B are graphs indicating leakage and dynamic power of an embodiment of the present invention.

FIG. 5 and FIG. 6 give the corresponding $P_{LEAKSLEEP}$ and $P_{DynOvh}$ waveforms using the prior approach and an approach according to an embodiment of the invention. In this example, it is assumed that the number of tiles, N=4. FIG. 5A illustrates the rapid convergence of the leakage current in the conventional case. The leakage current converges more slowly using the progressive scheme according to an embodiment of the invention as is shown in FIG. 6A. In the conventional approach $P_{DynOvh}$ is completely dissipated right after the bank deactivated, as can be seen in FIG. 5B. In comparison, the progressive scheme according to an embodiment of the invention distributes $P_{DynOvh}$ over a large number of cycles (N×Ts) as determined by the timer (in FIG. 4), as is shown in FIG. 6B. The progressive scheme may result in overall power savings if the memory bank is accessed very often (large $\alpha$). In this case, while leakage current reduction is smaller, dynamic power overhead is also reduced as compared with the conventional scheme. Thus, the condition for the progressive scheme to win is:

$$\alpha \cdot P_{DyrOvh\_PROGRESSIVE} + (1-\alpha) P_{LEAKSLEEP\_PROGRESSIVE} \leq \alpha P_{DyOVh\_PROGRESSIVE} + (1-\alpha) P_{LEAKSLEEP} \quad \text{EQ 2}$$

If a sleep transistor is turned on and off again, in rapid succession, a large amount of power may be used. As a result, the amount of power overhead may greatly increase. By selectively deactivating the sleep transistors in accordance with an embodiment of the present invention, the power overhead can be reduced or minimized. This may accomplished as described above by progressively turning off the sleep transistors upon the deactivation of the memory bank. The rate at which the sleep transistors are deactivated may be varied depending upon how often the memory bank is accessed. Memory banks that are accessed more frequently may have their sleep transistors deactivated at a slower rate, or memory banks that are accessed infrequently may have their sleep transistors deactivated at a higher rate, or all at once. The control circuit 228 may monitor how often a memory bank is accessed. The control circuit 228 may then adjust the activation and deactivation of the sleep transistors accordingly. For example, the sleep transistors may be turned off one at time at certain pre-determined intervals as discussed above, may be turned off in a group, or may be turned off all at once. Higher overall power savings may be achieved by reducing both the leakage and overhead dynamic power.

The embodiments illustrated and discussed in this specification are intended only to teach those skilled in the art the best way known to the inventors to make and use the invention. Nothing in this specification should be considered as limiting the scope of the present invention. The above-described embodiments of the invention may be modified or varied, and elements added or omitted, without departing from the invention, as appreciated by those skilled in the art in light of the above teachings. It is therefore to be understood that, within the scope of the claims and their equivalents, the invention may be practiced otherwise than as specifically described.

What is claimed is:

1. An apparatus, comprising:
   a plurality of memory blocks;
   a supply line;
   virtual supply lines coupled to respective ones of the memory blocks;
   a plurality of switches, wherein respective ones of said plurality of switches are coupled to respective ones of the memory blocks and the supply line via respective virtual supply lines, the switches adapted to be on and off to provide a first and a second voltage from the supply line to the memory block, wherein the second voltage is lower than the first voltage or the second voltage is higher then the first voltage, respectively;
   a control circuit to provide control signals to turn the switches on or off, wherein the control circuit is a timer, and wherein the control signals are adapted to progressively activate or deactivate the switches; and
   a plurality of diodes coupled to respective ones of the virtual supply lines and to the supply line.

2. The apparatus of claim 1 wherein the memory blocks are sub-blocks of a memory cache.

3. The apparatus of claim 1 wherein the memory blocks are sub-blocks of a divided SRAM cache.

4. A method, comprising:
   providing a memory divided into a plurality of memory blocks;
   providing a supply line;
   disposing a plurality of switches, wherein respective ones of said plurality of switches are coupled to respective ones of the memory blocks and the supply line to create a plurality of virtual supply lines; and
   providing a control circuit adapted to supply control signals to the plurality of switches to selectively couple the memory block to the supply line, the control circuit adapted to provide the control signals to selectively connect and disconnect selected ones of the memory blocks from the supply line; and
   determining a frequency in which each memory block has been accessed, wherein the control circuit provides the control signal to progressively disconnect the memory blocks based on the frequency.

5. An apparatus, comprising:
   a plurality of memory blocks;
   a supply line;
   virtual supply lines coupled to respective ones of the memory blocks;
   a plurality of switches, wherein respective ones of said plurality of switches are coupled to respective ones of the memory blocks and the supply line via respective virtual supply lines, the switches adapted to be on and off to provide a first and a second voltage from the supply line to the memory block, wherein the second voltage is lower than the first voltage or the second voltage is higher than the first voltage, respectively; and
   a control circuit to provide control signals to turn the switches on or off, wherein the control circuit is adapted to progressively turn the switches off based on a frequency in which each memory block is accessed.

* * * * *